United States Patent
Kim et al.

(10) Patent No.: US 9,472,409 B2
(45) Date of Patent: Oct. 18, 2016

(54) METHOD OF FORMING A METAL PATTERN AND METHOD OF MANUFACTURING A DISPLAY SUBSTRATE

(71) Applicant: SAMSUNG DISPLAY CO., LTD., Yongin, Gyeonggi-Do (KR)

(72) Inventors: Duk-Sung Kim, Asan-si (KR); Seung-Hyun Park, Seoul (KR); Seul-Ki Kim, Nam-gu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/662,213

(22) Filed: Mar. 18, 2015

(65) Prior Publication Data

US 2016/0056042 A1    Feb. 25, 2016

(30) Foreign Application Priority Data

Aug. 22, 2014   (KR) .................. 10-2014-0109820

(51) Int. Cl.
*H01L 21/28* (2006.01)
*H01L 21/283* (2006.01)
*H01L 27/12* (2006.01)

(52) U.S. Cl.
CPC ....... *H01L 21/283* (2013.01); *H01L 21/28008* (2013.01); *H01L 27/1262* (2013.01)

(58) Field of Classification Search
CPC .......... H01L 21/283; H01L 21/28008; H01L 27/1261; H01L 27/3248
See application file for complete search history.

(56) References Cited

FOREIGN PATENT DOCUMENTS

| KR | 2002-0064067 A | 8/2002 |
| KR | 10-2008-0056811 A | 6/2008 |
| KR | 10-2010-0035131 A | 4/2010 |
| KR | 10-2012-0019024 A | 3/2012 |

*Primary Examiner* — Armando Rodriguez
(74) *Attorney, Agent, or Firm* — Lewis Roca Rothgerber Christie LLP (57) ABSTRACT

A method of forming a metal pattern is disclosed. According to the method, a gate electrode and a pixel electrode are formed on a substrate. A metal layer is formed covering the gate electrode and the pixel electrode. A photo pattern is formed wherein a thickness of an area of the photo pattern that overlaps the gate electrode is smaller than a thickness of other areas of the photo pattern. The photo pattern is soft-baked. The photo pattern is exposed to light. The photo pattern is developed to expose a portion of the metal layer that overlaps the gate electrode. The exposed portion of the metal layer is removed to form a source electrode and a drain electrode, the source electrode and the drain electrode being spaced apart from each other with respect to the gate electrode.

12 Claims, 8 Drawing Sheets

METHOD OF FORMING A METAL PATTERN AND METHOD OF MANUFACTURING A DISPLAY SUBSTRATE

CROSS-REFERENCE TO RELATED APPLICATION

This U.S. non-provisional application claims priority to and the benefit of Korean Patent Application No. 10-2014-0109820, filed on Aug. 22, 2014, the disclosure of which is incorporated by reference herein in its entirety.

BACKGROUND

1. Field

Aspects of exemplary embodiments of the present invention relate to a method of forming a metal pattern and a method of manufacturing a display substrate, and more particularly, to a method of forming a fine metal pattern and a method of manufacturing a display substrate.

2. Description of the Related Art

A liquid crystal display apparatus is a kind of flat panel display (FPD), which has received broad use recently. Examples of the flat panel display include, but are not limited to, a liquid crystal display ("LCD"), a plasma display panel ("PDP") and an organic light emitting diode ("OLED") display.

The liquid crystal display apparatus includes a liquid crystal display panel displaying an image. A line pattern is formed by a metal which is patterned using masks to form the line pattern. However, a mask can result in a high cost. As such, a halftone mask including a slit area, a blocking area, and a transparent area may be used in order to reduce the number of masks used or required.

When a photo pattern is formed using a halftone mask, the photo pattern includes areas having different thicknesses. An etch-back process is used to remove areas having a thickness which is less than the other areas. Generally, the etch-back process is a dry etching process, so that the patterning of the line pattern may not be set up inline. Furthermore, a dry etcher can have a high cost.

SUMMARY

Aspects of exemplary embodiments are directed toward a method of forming a metal pattern while skipping a dry etching process of a photo pattern.

Aspects of exemplary embodiments are directed toward a method of manufacturing a display substrate utilizing the improved process.

In accordance with an exemplary embodiment of the present invention, a method of forming a metal pattern is provided. According to the method, a gate electrode and a pixel electrode are formed on a substrate. A metal layer is formed covering the gate electrode and the pixel electrode. A photo pattern is formed wherein a thickness of an area of the photo pattern that overlaps the gate electrode is smaller than a thickness of other areas of the photo pattern. The photo pattern is soft-baked. The photo pattern is exposed to light. The photo pattern is developed to expose a portion of the metal layer that overlaps the gate electrode. The exposed portion of the metal layer is removed to form a source electrode and a drain electrode, the drain electrode being spaced apart from the source electrode with respect to the gate electrode.

In an exemplary embodiment of the present invention, the area of the photo pattern that overlaps the gate electrode may have a thickness of about 0.1 µm to about 0.2 µm.

In an exemplary embodiment of the present invention, the photo pattern may be soft-baked within a temperature range of about 80° C. to about 120° C.

In an exemplary embodiment of the present invention, the photo pattern may be exposed to an amount of ultraviolet light with energy of about 40 mJ to about 60 mJ.

In an exemplary embodiment of the present invention, the photo pattern may be developed with a developer for about 30 seconds to about 90 seconds.

In an exemplary embodiment of the present invention, a transparent metal layer may be formed. A gate metal layer may be formed on the transparent metal layer. A first pattern and a second pattern may be formed on the gate metal layer, the first pattern may have a first thickness on a first area and the second pattern may have a second thickness on a second area, the second thickness may be smaller than the first thickness. A portion of the transparent metal layer and the gate metal layer may be removed utilizing the first pattern and the second pattern as a mask, to form a gate pattern and a pixel pattern. The first pattern and the second pattern may be soft-baked. The first pattern and the second pattern may be exposed to light. The first pattern and the second pattern may be developed to expose a portion of the gate metal layer by removing the second pattern. The exposed portion of the gate metal layer may be removed.

In an exemplary embodiment of the present invention, the first pattern and the second pattern may be soft-baked within a temperature range of about 80° C. to about 120° C.

In an exemplary embodiment of the present invention, the first pattern and the second pattern may be exposed to an amount of ultraviolet light with energy of about 40 mJ to about 60 mJ.

In an exemplary embodiment of the present invention, the gate metal layer may include a low resistance material.

In an exemplary embodiment of the present invention, the low resistance material may include aluminum (Al), molybdenum (Mo), titanium (Ti), copper (Cu) and/or an alloy thereof.

In an exemplary embodiment of the present invention, the transparent metal layer may include a transparent conductive material.

In an exemplary embodiment of the present invention, the transparent conductive material may include indium tin oxide (ITO), indium zinc oxide (IZO) and/or aluminum zinc oxide (AZO).

In accordance with an exemplary embodiment of the present invention, a method of manufacturing of a display substrate is provided. According to the method, a gate electrode and a pixel electrode are formed on a first substrate. A metal layer is formed covering the gate electrode and the pixel electrode. A photo pattern is formed wherein a thickness of an area of the photo pattern that overlaps the gate electrode is smaller than a thickness of other areas of the photo pattern. The photo pattern is soft-baked. The photo pattern is exposed to light. The photo pattern is developed to expose a portion of the metal layer overlapping the gate electrode. The exposed portion of the metal layer is removed to form a source electrode and a drain electrode, the drain electrode being spaced apart from the source electrode with respect to the gate electrode.

In an exemplary embodiment of the present invention, the area of the photo pattern that overlaps the gate electrode may have a thickness of about 0.1 µm to about 0.2 µm.

In an exemplary embodiment of the present invention, the photo pattern may be soft-baked within a temperature range of about 80° C. to about 120° C.

In an exemplary embodiment of the present invention, the photo pattern may be exposed to an amount of ultraviolet light with energy of about 40 mJ to about 60 mJ.

In an exemplary embodiment of the present invention, the photo pattern may be developed with a developer for about 30 seconds to about 90 seconds.

In an exemplary embodiment of the present invention, a transparent metal layer may be formed. A gate metal layer may be formed on the transparent metal layer. A first pattern and a second pattern may be formed on the gate metal layer, the first pattern may have a first thickness on a first area and the second pattern may have a second thickness on a second area, the second thickness may be smaller than the first thickness. A portion of the transparent metal layer and the gate metal layer may be removed utilizing the first pattern and the second pattern as a mask, to form a gate pattern and a pixel pattern. The first pattern and the second pattern may be soft-baked. The first pattern and the second pattern may be exposed to light. The first pattern and the second pattern may be developed to expose a portion of the gate metal layer by removing the second pattern. The exposed portion of the gate metal layer may be removed.

In an exemplary embodiment of the present invention, the gate metal layer may include a low resistance material.

In an exemplary embodiment of the present invention, the transparent metal layer may include a transparent conductive material.

In accordance with example embodiments of the present invention, a method of forming a metal pattern utilizing a halftone mask may be simplified by skipping a dry etching process of a photo pattern, so that a process cost may be decreased.

BRIEF DESCRIPTION OF THE DRAWINGS

Aspects of embodiments of the present invention will become more apparent by describing, in detail, exemplary embodiments thereof with reference to the accompanying drawings, in which:

FIGS. 4A to 5E are cross-sectional views illustrating a method of manufacturing a display substrate in accordance with exemplary embodiments of the present invention.

DETAILED DESCRIPTION

Hereinafter, exemplary embodiments of the present invention will be described in detail with reference to the accompanying drawings.

It will be understood that when an element or layer is referred to as being "on", "connected to", or "coupled to" another element or layer, it can be directly on, connected to, or coupled to the other element or layer, or one or more intervening elements or layers may be present. In contrast, when an element or layer is referred to as being "directly on," "directly connected to", or "directly coupled to" another element or layer, there are no intervening elements or layers present.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

Figure 1:
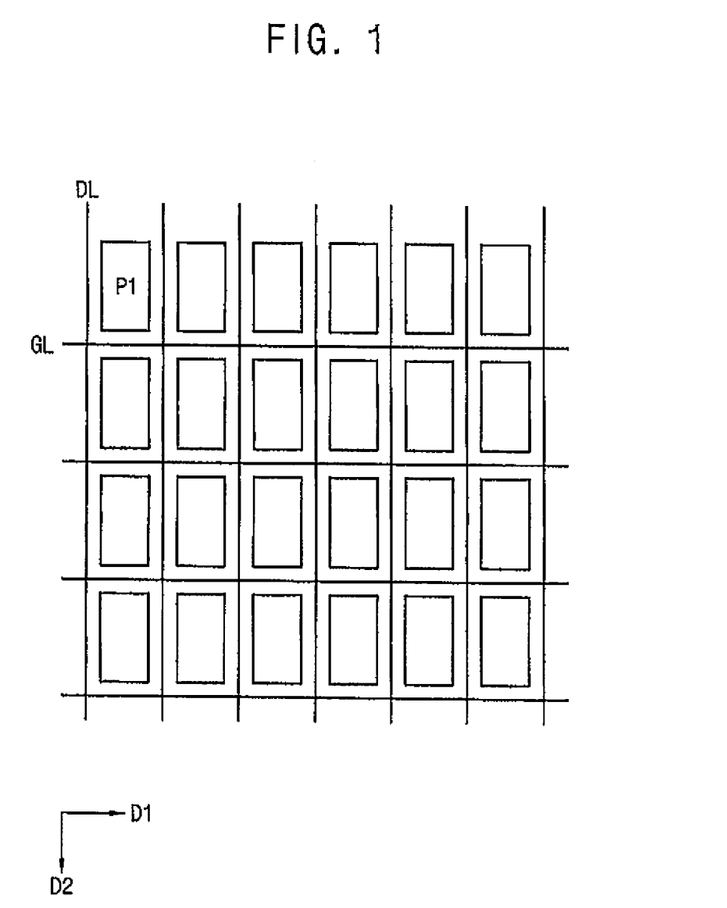
FIG. 1 is a plan view illustrating a display panel in accordance with an exemplary embodiment of the present invention.

FIG. 1 is a plan view illustrating a display panel in accordance with an exemplary embodiment of the present invention;

Referring to FIG. 1, a display panel includes a plurality of gate lines GL, a plurality of data lines DL and a plurality of pixels.

The gate lines GL may extend in a first direction D1. The data lines DL may extend in a second direction crossing or substantially perpendicular (e.g., perpendicular) to the first direction D1. Alternatively, the gate lines GL may extend in the second direction D2 and the data lines DL may extend in the first direction D1.

The pixels may be arranged in a matrix shape. The pixels may be disposed in areas defined by the gate lines GL and the data lines DL.

Each pixel may be connected (e.g., coupled) to a corresponding gate line GL and a corresponding data line DL adjacent to the pixel.

Each pixel may have a rectangle shape extending in the second direction D2. Alternatively, the pixel may have a V-shape, a Z-shape or the like.

Figure 2:
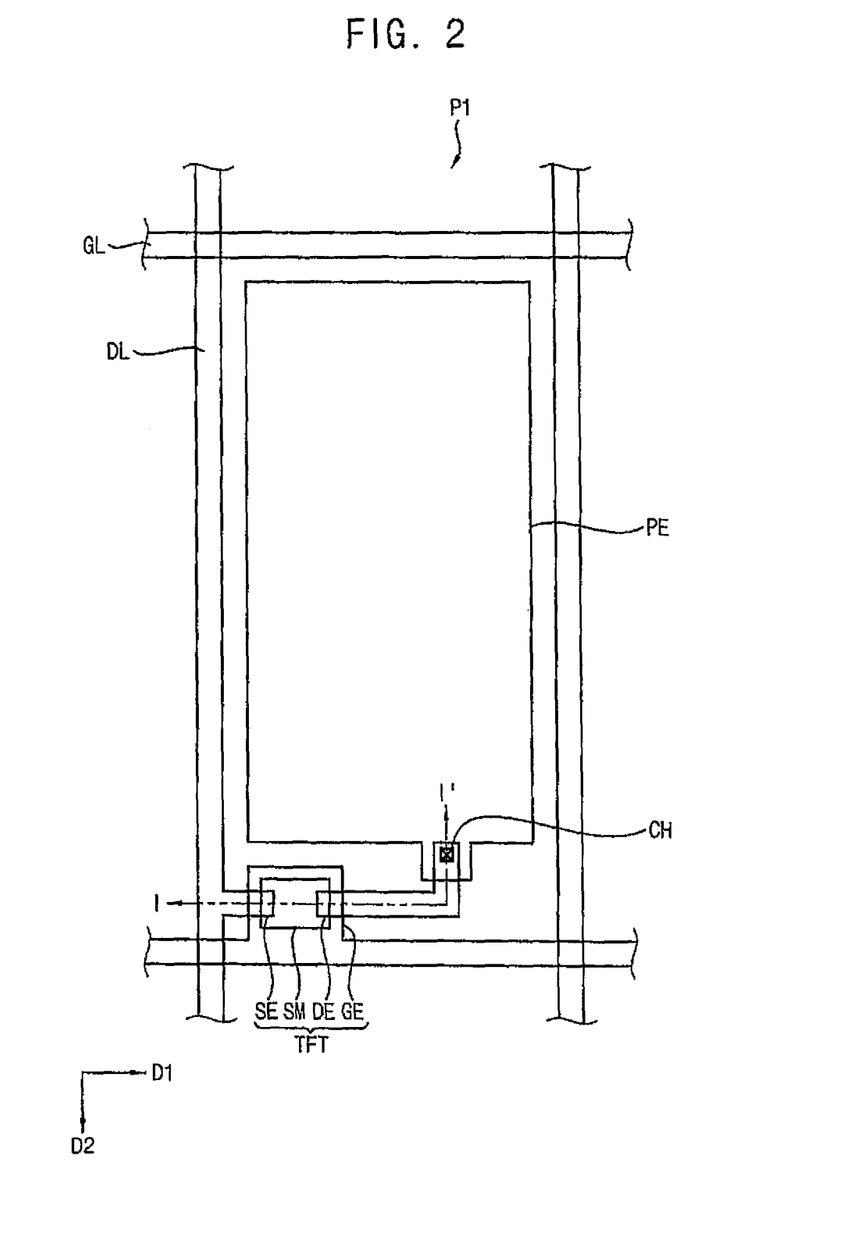
FIG. 2 is a plan view illustrating a first pixel of the display panel in FIG. 1.
Figure 3:
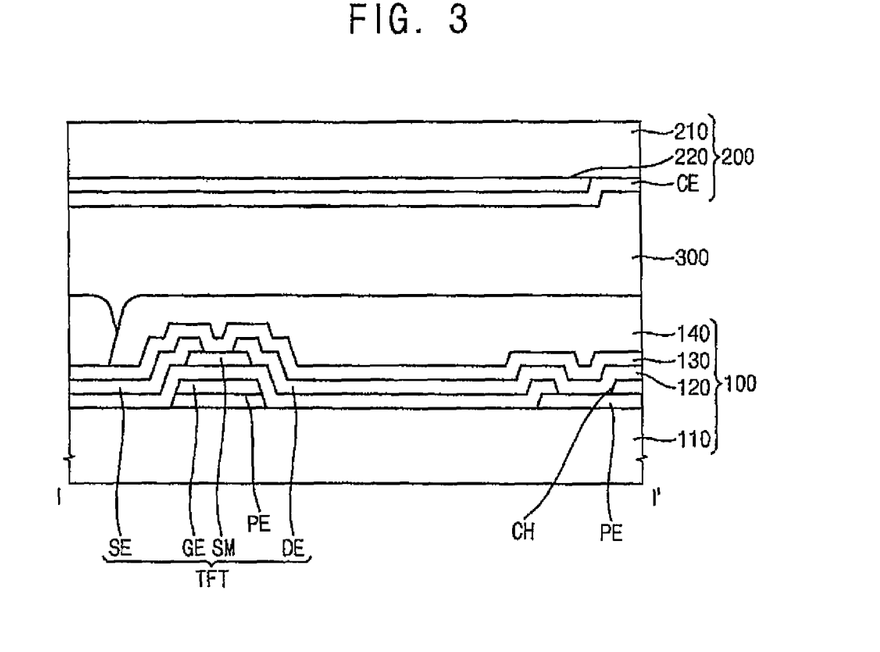
FIG. 3 is a cross-sectional view taken along the line I-I' in FIGS. 2.

FIG. 2 is a plan view illustrating a first pixel of the display panel in FIG. 1. FIG. 3 is a cross-sectional view taken along the line I-I' in FIG. 2.

Referring to FIGS. 1 to 3, the display panel includes a first substrate 100, a second substrate 200 and a liquid crystal layer 300.

The first substrate 100 includes a first base substrate 110, thin film transistors TFT, a pixel electrode PE, an insulating layer 120, a passivation layer 130 and a color filter 140.

The first base substrate 110 may be a transparent insulating substrate. Examples of the transparent insulating substrate may be, but are not limited to, a glass substrate, a plastic substrate or the like. The first base substrate 110 may include a plurality of pixel areas for displaying an image. A plurality of the pixel areas may be disposed in a matrix shape having a plurality of rows and a plurality of columns.

Each pixel may further include a switching element. The switching element may be a thin film transistor TFT. The switching element may be connected (e.g., coupled) to the gate line GL and the data line DL adjacent to the switching element. The switching element may be disposed at a crossing area of the gate line GL and the data line DL.

A gate pattern may include a gate electrode GE and the gate line GL. The gate pattern may be disposed on the first base substrate 110. The gate line GL is electrically (e.g., coupled) to the gate electrode GE.

The gate pattern may include a low resistance material, such as aluminum (Al), molybdenum (Mo), titanium (Ti), copper (Cu) or an alloy thereof. The gate pattern may be formed in a single layer or a multi layer.

A pixel electrode PE is disposed on the first base substrate 110. The pixel electrode PE may be disposed on the pixel area, and the pixel electrode PE may be also disposed on a lower surface of the gate pattern.

The pixel electrode PE may include a transparent conductive material, such as indium tin oxide (ITO), indium zinc oxide (IZO) or aluminum zinc oxide (AZO). The pixel electrode PE may have a slit pattern.

The insulating layer 120 may cover the gate pattern and the pixel electrode PE, and may insulate the gate pattern and the pixel electrode PE.

The insulating layer 120 may include an inorganic insulating material. For example, the insulating layer 120 may include silicon oxide (SiOX) and/or silicon nitride (SiNX). The insulating layer 120 may be formed by a sputtering process.

The insulating layer 120 may include a contact opening or hole CH which exposes a portion of the pixel electrode PE.

A semiconductor pattern SM may be disposed on the insulating layer 120. The semiconductor pattern SM may overlap the gate electrode GE.

A data pattern may include the data line DL, a source electrode SE and a drain electrode DE. The data pattern may be disposed on the semiconductor pattern SM, which is formed on the insulating layer 120.

The source electrode SE may overlap the semiconductor pattern SM. The source electrode SE may be electrically connected (e.g., coupled) to the data line DL. The drain electrode DE may be spaced apart from the source electrode SE with respect to the semiconductor pattern SM. The semiconductor pattern SM may have a conductive channel between the source electrode SE and the drain electrode DE.

The drain electrode DE of the thin film transistor TFT may be electrically connected (e.g., coupled) to the pixel electrode PE through the contact hole CH. A grayscale voltage (e.g., a gray level voltage) may be applied to the pixel electrode PE through the thin film transistor TFT.

The thin film transistor TFT may include the gate electrode GE, the source electrode SE, the drain electrode DE and the semiconductor pattern SM.

The passivation layer 130 may cover the thin film transistor TFT, and may insulate the thin film transistor TFT.

The passivation layer 130 may include an inorganic insulating material. For example, the passivation layer 130 may include silicon oxide (SiOX) and/or silicon nitride (SiNX). The passivation layer 130 may be formed by a sputtering process.

The color filter 140 is disposed on the passivation layer 130.

The color of light may be changed by the color filter 140, and the light may penetrate the liquid crystal layer 300. Color filters 140 may include a red color filter, a green color filter, and a blue color filter.

Each of the color filters 140 may correspond to one of the pixel areas. Color filters, which are adjacent to each other, may have different colors from each other.

The color filters 140 may overlap on a border between pixel areas adjacent to each other. Alternatively, the color filters 140 may be spaced apart from a border between pixel areas adjacent to each other in the first direction D1. The color filters 140 may be formed in an island-shape at a corresponding one of the crossing regions of the gate lines GL and the data lines DL.

The second substrate 200 includes a second base substrate 210, a black matrix 220 and a common electrode CE.

The second base substrate 210 may be a transparent insulating substrate. Examples of the transparent insulating substrate may be, but are not limited to, a glass substrate, a plastic substrate or the like.

The black matrix 220 is disposed on the second base substrate 210. The black matrix 220 may be formed on the gate pattern and the data pattern, and be configured to block light (e.g., to prevent transmission and reflection of light).

The common electrode CE is formed on the second base substrate 210.

A grayscale voltage (e.g., a gray level voltage) may be applied to the pixel electrode PE and the common electrode CE to form an electric field. The common electrode CE may include a transparent conductive material, such as indium tin oxide (ITO), indium zinc oxide (IZO) or aluminum-doped zinc oxide (AZO). The common electrode CE may have a slit pattern.

The liquid crystal layer 300 may be disposed between the first substrate 100 and the second substrate 200.

The liquid crystal layer 300 may include liquid crystal molecules. An alignment of the liquid crystal molecules in the liquid crystal layer 300 may be controlled by an electric field applied between the pixel electrode PE and the common electrode CE. Therefore, a light transmittance of the pixel may be controlled.

Method of Forming a Metal Pattern and Method of Manufacturing a Display Substrate FIGS. 4A to 5E are cross-sectional views illustrating a method of manufacturing a display substrate in accordance with exemplary embodiments of the present invention.

Referring to FIGS. 4A to 5E, acts of forming a metal pattern and manufacturing a display substrate in accordance with an exemplary embodiment of the present invention are illustrated in more detail.

Figure 4A:
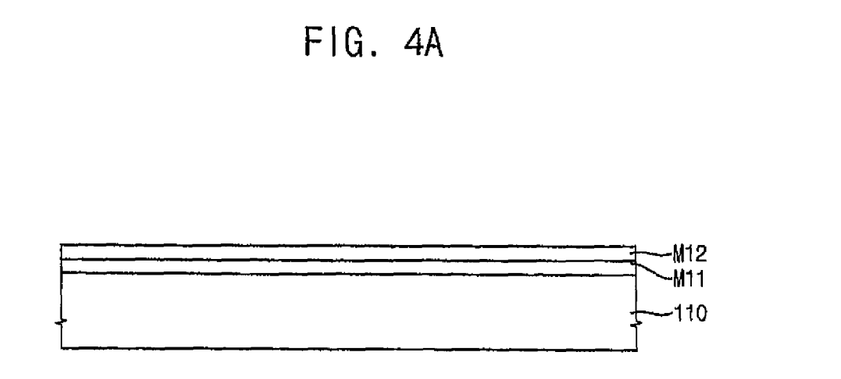

Referring to FIG. 4A, a transparent metal layer M11 is formed on a first base substrate 110, and then a gate metal layer M12 is formed. The gate metal layer M12 may be formed on the transparent metal layer M11.

The transparent metal layer M11 may include a transparent conductive material, such as indium tin oxide (ITO), indium zinc oxide (IZO) and aluminum-doped zinc oxide (AZO).

The gate metal layer M12 may include a low resistance material, such as aluminum (Al), molybdenum (Mo), titanium (Ti), copper (Cu) or an alloy thereof. The gate metal layer M12 may be formed in a single layer or a multi-layer.

Figure 4B:
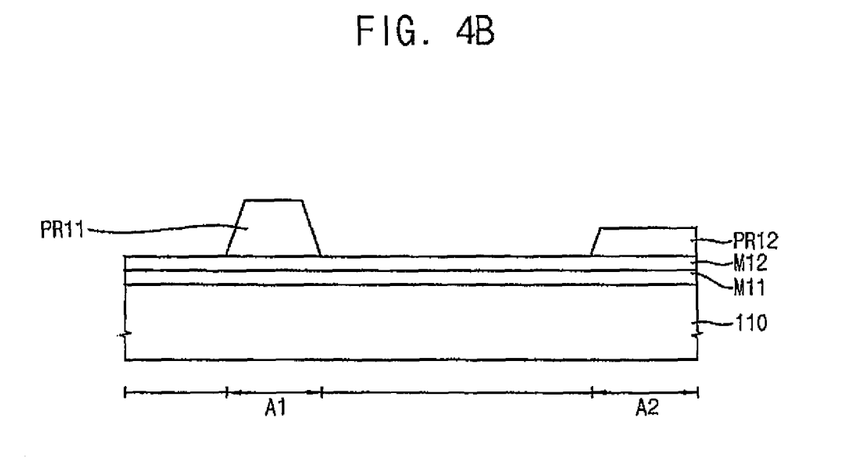

Referring to FIG. 4B, a photoresist material is coated on the gate metal layer M12 to form a photoresist layer. A halftone mask including a slit area, a blocking area and a transparent area may be disposed on the photoresist layer. The photoresist layer may be exposed to light using the halftone mask, and then developed to form a first pattern PR11 and a second pattern PR12.

The photoresist material may include a positive-type photoresist compound or a negative-type photoresist compound. For example, the photoresist material may include a positive-type photoresist compound.

The first pattern PR11 and the second pattern PR12 may be formed by a halftone process. The halftone process may include a coating, a soft-baking, an UV exposing, a hard-baking, and a developing.

The first pattern PR11 may overlap a gate pattern. For example, the first pattern PR11 may be formed on a first area A1. The first area A1 is an area, which forms the gate pattern.

The second pattern PR 12 may overlap a pixel electrode PE. For example, the second pattern PR12 may be formed on a second area A2. The second area A2 is an area, which forms the pixel electrode PE.

The first pattern PR11 has a first thickness, and the second pattern PR12 has a second thickness. The second thickness may be less than the first thickness.

Figure 4C:
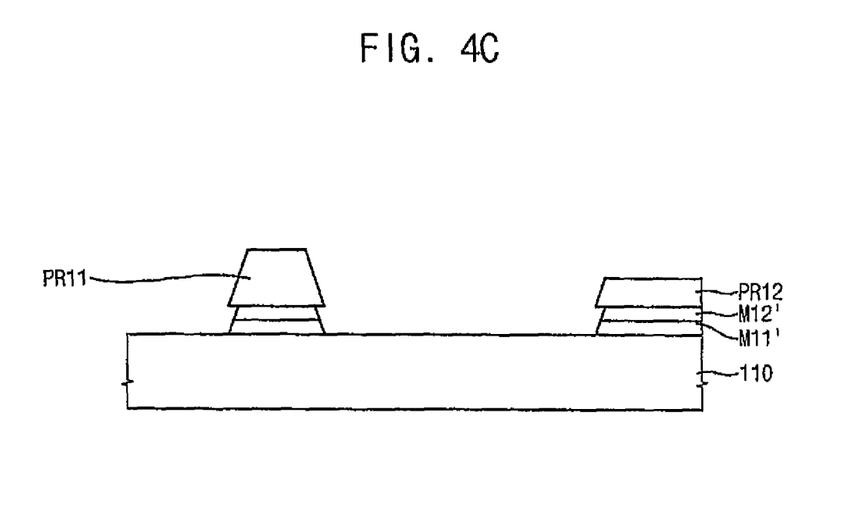

Referring to FIG. 4C, an exposed portion of the transparent metal layer M11 and the gate metal layer M12 is removed using the first pattern PR11 and the second pattern PR12 as a mask. Therefore, a gate pattern may be formed on a lower surface of the first pattern PR11, and a pixel pattern may be formed on a lower surface of the second pattern PR12.

When the gate pattern is formed on a lower surface of the first pattern PR11, a portion of the transparent metal layer M11 and the gate metal layer M12 is removed, so that the gate pattern may include a remaining portion of the transparent metal layer M11 and the gate metal layer M12. Thus, the gate pattern may include a portion of a transparent electrode pattern M11' and a gate electrode pattern M12'.

When the pixel pattern may be formed on a lower surface of the second pattern PR12, a portion of the transparent metal layer M11 and the gate metal layer M12 is removed. The pixel pattern may include a remaining portion of the transparent metal layer M11 and the gate metal layer M12. For example, the pixel pattern may include another portion of the transparent electrode pattern M11' and the gate electrode pattern M12'.

The transparent metal layer M11 and the gate metal layer M12 may be etched using an etchant. The etchant may include a compound having fluorine.

The transparent metal layer M11 and the gate metal layer M12 may be wet-etched to form the gate pattern and the pixel pattern, so that a width of the first pattern PR11 and the second pattern PR12 may be greater than a width of the gate pattern and the pixel pattern. Thus, an edge of the gate pattern and an edge of the first pattern PR11 may not match, and an edge of the pixel pattern and an edge of the second pattern PR12 may not match.

Figure 4D:
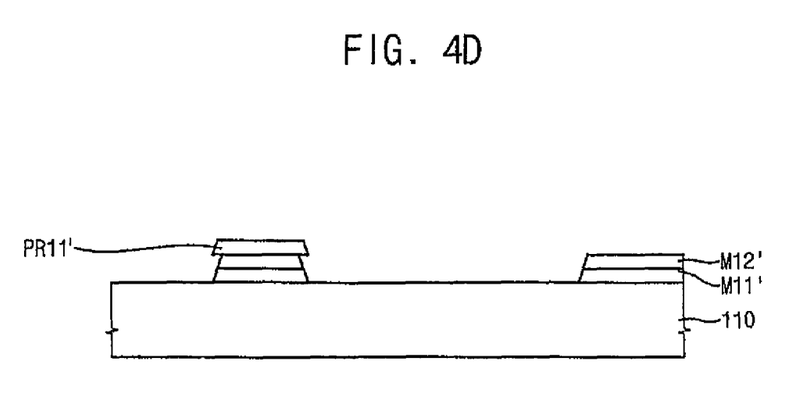

Referring to FIG. 4D, the first pattern PR11 and the second pattern PR12 are wet-etched, so that a first etch-back pattern PR11' is formed from the first pattern PR11, and the second pattern PR12 is removed.

The first pattern PR11 and the second pattern PR12 are soft-baked. Therefore, a solvent of the first pattern PR11 and the second pattern PR12 may be removed by soft-baking.

For example, the first pattern PR11 and the second pattern PR12 may be soft-baked within a temperature range of about 80° C. to about 120° C. for about 30 seconds to about 90 seconds.

The first pattern PR11 and the second pattern PR12 may be exposed to light. The first pattern PR11 and the second pattern PR12 may be activated by light and the first pattern PR11 and the second pattern PR12 may be developed with a developer. For example, when the first pattern PR11 and the second pattern PR12 are exposed to light, the first pattern PR11 and the second pattern PR12 may be dissolved, thus activating the first pattern PR11 and the second pattern PR12.

The first pattern PR11 and the second pattern PR12 may be exposed to an amount of ultraviolet light with energy of about 40 mJ to about 60 mJ, for about 5 seconds to about 20 seconds.

The first pattern PR11 and the second pattern PR12 may be developed with a developer to form the first etch-back pattern PR11' and to remove the second pattern PR12.

Therefore, the second pattern PR12 is removed so that the gate electrode pattern M12' is exposed.

The first pattern PR11 and the second pattern PR12 may be developed with a developer for about 30 seconds to about 90 seconds. When the first pattern PR11 and the second pattern PR12 are developed less than 30 seconds, the second pattern PR12 may remain. When the first pattern PR11 and the second pattern PR12 are developed more than 90 seconds, the first pattern PR11 may be removed, so that the first etch-back pattern PR11' may not be formed, thus the gate electrode pattern M12' may not be covered by the first etch-back pattern PR11'.

The developer may be an alkali solution. For example, the alkali solution may include sodium hydroxide, potassium hydroxide, sodium carbonate, ethylamine, triethylamine, triethanolamine, tetramethylammonium hydroxide (TMAH), pyrrole, piperidine or the like.

Figure 4E:
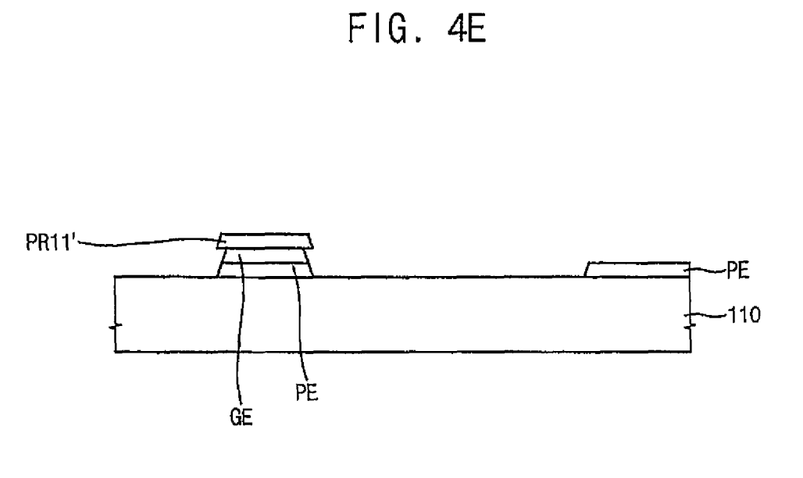

Referring to FIG. 4E, the gate electrode pattern M12' of the pixel pattern may be removed to form the pixel electrode PE.

The gate electrode pattern M12' of the pixel pattern may be etched using an etchant. For example, the etchant may include ammomium persulfate ($(NH_4)_2S_2O_8$).

Figure 4F:
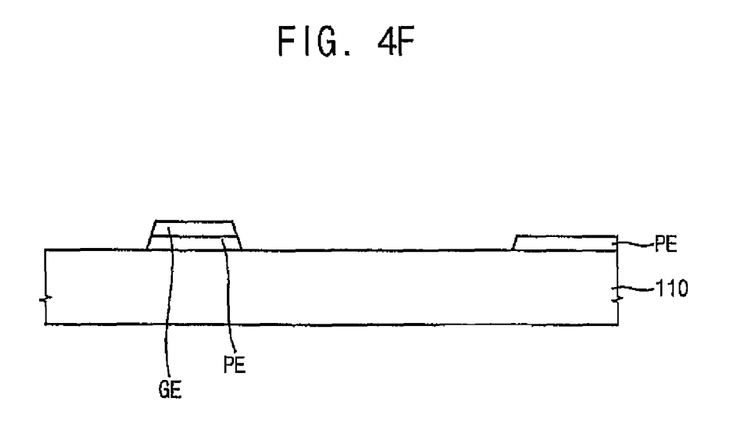
Figure 5A:
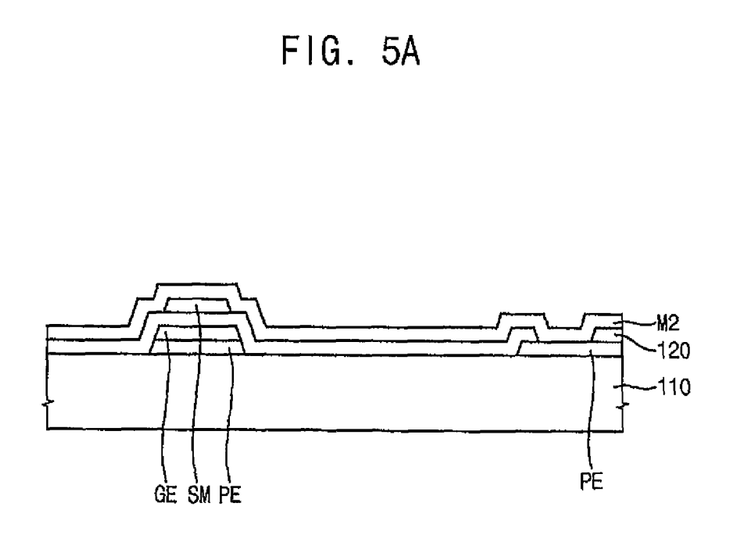
Figure 5B:
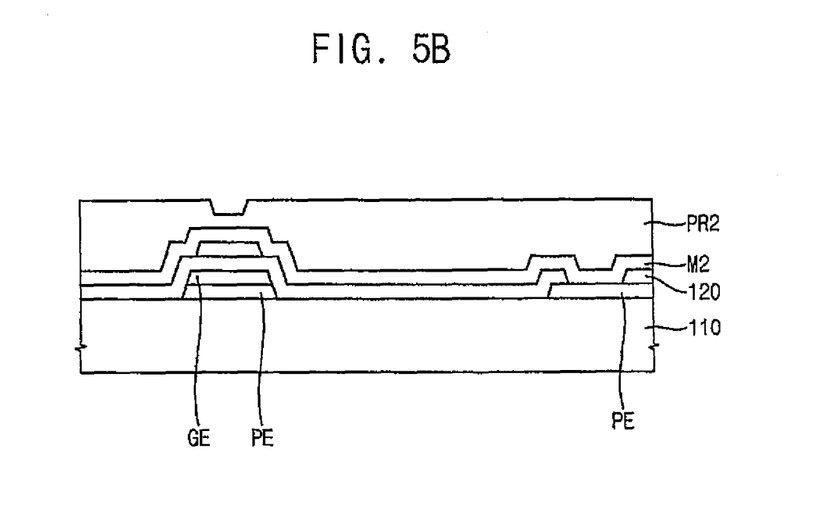
Figure 5C:
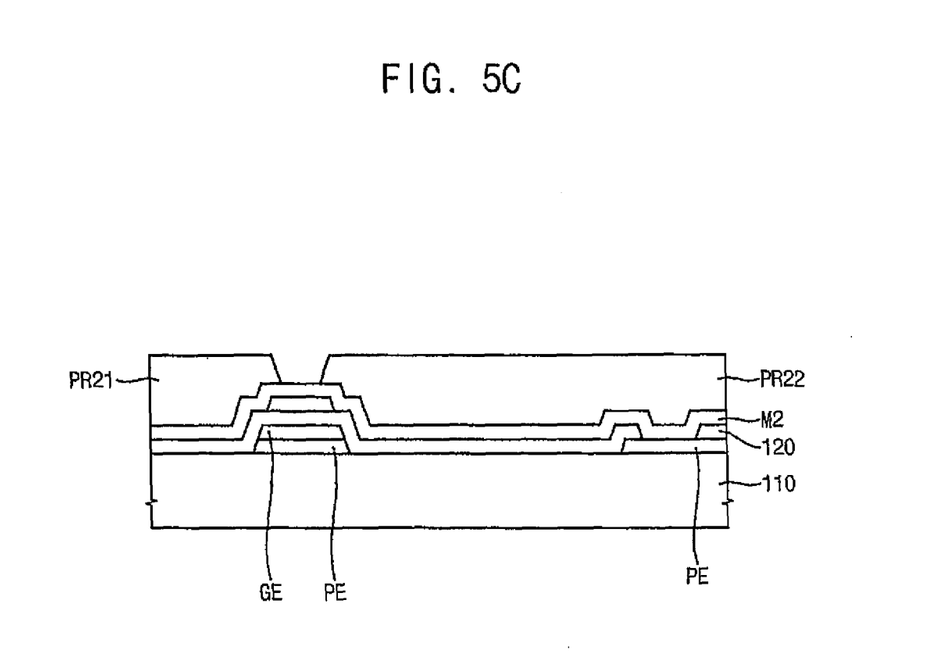
Figure 5D:
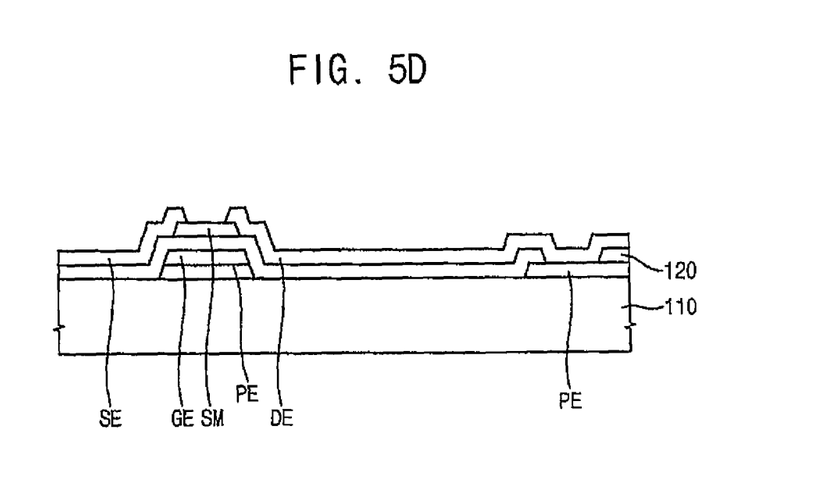
Figure 5E:
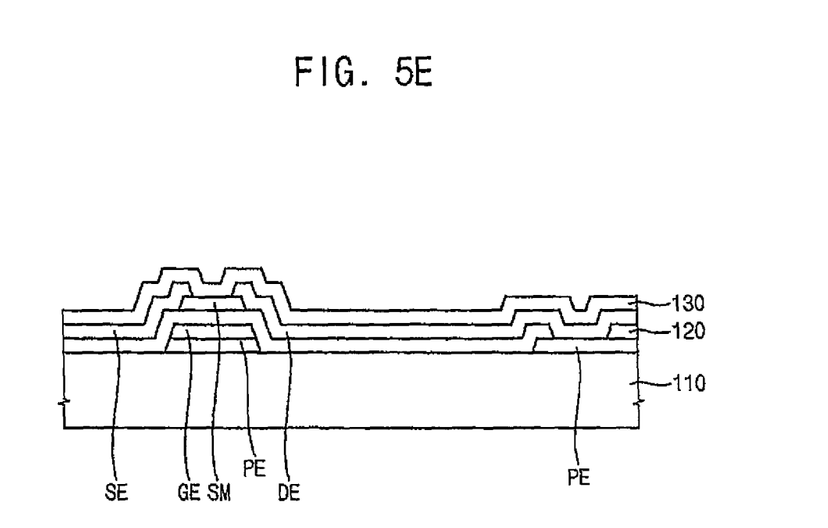

Referring to FIG. 4F, the first etch-back pattern PR11' may be removed by stripping. Thus, the gate electrode GE and the pixel electrode PE may be formed.

Referring to FIGS. 5A to 5E, the insulating layer 120 may be formed on the gate electrode GE and the pixel electrode PE, which are formed on the first base substrate 110, and may insulate the gate electrode GE and the pixel electrode PE.

A portion of the insulating layer 120 is removed to form a contact hole CH which exposes a portion of the pixel electrode PE.

A semiconductor pattern SM may be formed on the insulating layer 120, and the semiconductor pattern SM may overlap the gate electrode GE. The semiconductor pattern SM may include an oxide, such as indium (In), zinc (Zn), gallium (Ga), tin (Sn) or the like. For example, the oxide may be zinc oxide (ZnOX), zinc gallium oxide (ZnGaXOY), zinc indium oxide (ZnInXOY), zinc tin oxide (ZnSnXOY), gallium indium zinc oxide (GaInXZnYOZ), tin oxide (SnOX), gallium tin oxide (GaSnXOY) or the like. Alternatively, the semiconductor pattern SM may include amorphous silicon or polysilicon. For example, the semiconductor pattern SM may be crystallized and ion-doped.

A source metal layer M2 may be formed on the first base substrate 110. The source metal layer M2 may be connected (e.g., coupled) to the pixel electrode PE.

A photoresist material is coated on the source metal layer M2 to form a photoresist layer. A halftone mask including a slit area, a blocking area and a transparent area may be disposed on the photoresist layer. The photoresist layer may be exposed to light using the halftone mask, and then developed to form a photo pattern PR2.

The photoresist material may include a positive--type photoresist compound or a negative-type photoresist compound. For example, the photoresist material may include a positive-type photoresist compound.

A first portion of the photo pattern PR2 may overlap the gate electrode GE, and a second portion of the photo pattern PR2 may not overlap the gate electrode GE. A thickness of the first portion may be smaller than a thickness of the second portion. Therefore, the first portion may be removed, so that a portion of the source metal layer M2 may be exposed.

For example, the second portion of the photo pattern PR2 may have a thickness of about 1.5 µm to about 2.5 µm. However, a thickness of the first portion is smaller than a thickness of the second portion. For example, the thickness of the first portion may be about 0.1 µm to about 0.2 µm.

The first portion of the photo pattern PR2 may be disposed to form a conductive channel between the source electrode SE and the drain electrode DE.

The photo pattern PR2 may be wet-etched, so that the first portion of the photo pattern PR2 may be removed.

The photo pattern PR2 is soft-baked. Therefore, a solvent of the photo pattern PR2 may be removed by soft-baking.

For example, the photo pattern PR2 may be soft-baked within a temperature range of about 80° C. to about 120° C. for about 30 seconds to about 90 seconds.

The photo pattern PR2 may be exposed to light. The photo pattern PR2 may be activated by light, and the photo pattern PR2 may be developed with a developer. For example, when the photo pattern PR2 is exposed to light, the photo pattern PR2 may be dissolved, thus activating the photo pattern PR2.

The photo pattern PR2 may be exposed to an amount of ultraviolet light with energy of about 40 mJ to about 60 mJ, for about 5 seconds to about 20 seconds.

The photo pattern PR2 may be developed with a developer

Thus, a first photo pattern PR21 and a second photo pattern PR22 may be formed, the second photo pattern PR22 may be spaced apart from the first photo pattern PR21.

For example, the first photo pattern PR21 may be formed on the source electrode SE and the second photo pattern PR22 may be formed on the drain electrode DE.

Therefore, the first portion of the photo pattern PR2 is removed so that a portion of the source metal layer M2 is exposed.

For example, the photo pattern PR2 may be developed with a developer for about 30 seconds to about 90 seconds. When the photo pattern PR2 is developed less than 30 seconds, the first portion of the photo pattern PR2 may remain. When the photo pattern PR2 is developed more than 90 seconds, the photo pattern PR2 may be entirely removed, so that the first photo pattern PR21 and the second photo pattern PR22 may not be formed, thus the source metal layer M2 may not be covered by the first photo pattern PR21 and the second photo pattern PR22.

The developer may be an alkali solution. For example, the alkali solution may include sodium hydroxide, potassium hydroxide, sodium carbonate, ethylamine, triethylamine, triethanolamine, tetramethylammonium hydroxide (TMAH), pyrrole, piperidine or the like.

An exposed portion of the source metal layer M2 may be removed to form the source electrode SE and the drain electrode DE.

The source metal layer M2 may be etched using an etchant. For example, the etchant may include ammomium persulfate ((NH4)2S2O8).

The first photo pattern PR21 and the second photo pattern PR22 may be removed by stripping. Thus, the source electrode SE and the drain electrode DE may be formed.

Therefore, the thin film transistor including the gate electrode GE, the source electrode SE, the drain electrode DE and the semiconductor pattern SM may be formed. A passivation layer 130 may cover the thin film transistor TFT, and may insulate the thin film transistor TFT.

In accordance with exemplary embodiments of the present invention, the method of forming a fine metal pattern and the method of manufacturing the display substrate may apply to a liquid crystal display apparatus, an organic electroluminescent apparatus, or the like.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the following claims and their equivalents. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims, and equivalents thereof. The present invention is defined by the following claims, with equivalents of the claims to be included therein.

What is claimed is:

1. A method of forming a metal pattern, the method comprising:
   forming a gate electrode and a pixel electrode on a substrate;
   forming a metal layer covering the gate electrode and the pixel electrode;
   forming a photo pattern wherein a thickness of an area of the photo pattern that overlaps the gate electrode is smaller than a thickness of other areas of the photo pattern;
   soft-baking the photo pattern;
   exposing the photo pattern to light;
   developing the photo pattern to expose a portion of the metal layer that overlaps the gate electrode; and
   removing the exposed portion of the metal layer to form a source electrode and a drain electrode, the drain electrode being spaced apart from the source electrode with respect to the gate electrode.

2. The method of claim 1, wherein the area of the photo pattern that overlaps the gate electrode has a thickness of about 0.1 µm to about 0.2 µm.

3. The method of claim 1, wherein the photo pattern is soft-baked within a temperature range of about 80° C. to about 120° C.

4. The method of claim 1, wherein the photo pattern is exposed to an amount of ultraviolet light with energy of about 40 mJ to about 60 mJ.

5. The method of claim 1, wherein the photo pattern is developed with a developer for about 30 seconds to about 90 seconds.

6. The method of claim 1, further comprising:
   forming a transparent metal layer;
   forming a gate metal layer on the transparent metal layer;
   forming a first pattern and a second pattern on the gate metal layer, the first pattern having a first thickness on a first area and the second pattern having a second thickness on a second area, the second thickness being smaller than the first thickness;
   removing a portion of the transparent metal layer and the gate metal layer utilizing the first pattern and the second pattern as a mask, to form a gate pattern and a pixel pattern;

soft-baking the first pattern and the second pattern;
exposing the first pattern and the second pattern to light;
developing the first pattern and the second pattern to expose a portion of the gate metal layer by removing the second pattern; and
removing the exposed portion of the gate metal layer.

7. The method of claim 6, wherein the first pattern and the second pattern are soft-baked within a temperature range of about 80° C. to about 120° C.

8. The method of claim 6, wherein the first pattern and the second pattern are exposed to an amount of ultraviolet light with energy of about 40 mJ to about 60 mJ.

9. The method of claim 6, wherein the gate metal layer comprises a low resistance material.

10. The method of claim 9, wherein the low resistance material comprises at least one selected from the group consisting of aluminum (Al), molybdenum (Mo), titanium (Ti), copper (Cu) and/or an alloy thereof.

11. The method of claim 6, wherein the transparent metal layer comprises a transparent conductive material.

12. The method of claim 11, wherein the transparent conductive material comprises at least one selected from the group consisting of indium tin oxide (ITO), indium zinc oxide (IZO) and/or aluminum zinc oxide (AZO).

* * * * *